United States Patent [19]

Greeneich et al.

[11] 4,096,821
[45] Jun. 27, 1978

[54] SYSTEM FOR FABRICATING THIN-FILM ELECTRONIC COMPONENTS

[75] Inventors: Edwin W. Greeneich, Plum Borough; William S. Escott, McKeesport, both of Pa.

[73] Assignee: Westinghouse Electric Corp., Pittsburgh, Pa.

[21] Appl. No.: 749,870

[22] Filed: Dec. 13, 1976

[51] Int. Cl.² .................. C23C 13/08; B05B 15/04
[52] U.S. Cl. ........................... 118/10; 118/49; 118/301
[58] Field of Search ............... 118/10, 48, 49, 49.1, 118/301

[56] References Cited

U.S. PATENT DOCUMENTS

| | | | |
|---|---|---|---|
| 2,614,524 | 10/1952 | Haynes | 118/49 |
| 3,117,025 | 1/1964 | Learn et al. | 118/49 |
| 3,205,855 | 9/1965 | Ault | 118/49 |
| 3,230,109 | 1/1966 | Domaleski | 118/49 X |
| 3,636,917 | 1/1972 | Baker | 118/48 X |
| 3,669,060 | 6/1972 | Page et al. | 118/48 X |
| 3,747,558 | 7/1973 | Harel | 118/48 X |

FOREIGN PATENT DOCUMENTS 1,597,032  6/1970  France ..................... 118/48

OTHER PUBLICATIONS

Krongelb, IBM Technical Disclosure Bulletin, vol. 14, No. 3, Aug. 1971, pp. 772, 773.

*Primary Examiner*—Wm. Carter Reynolds
*Attorney, Agent, or Firm*—W. G. Sutcliff

[57] ABSTRACT

A system is disclosed for fabricating thin-film electronic components upon a substrate. A unitary metal aperture mask is utilized which includes a plurality of linearly aligned aperture patterns formed in the unitary mask. The mask is coupled with a linear motion assembly, and an electro-optic sensor which reads position indicating alignment marks upon the mask to provide precise and accurate mask alignment during subsequent fabrication steps in the vacuum deposition process. This system avoids the use of individual deposition masks which must be successively aligned.

1 Claim, 2 Drawing Figures

SYSTEM FOR FABRICATING THIN-FILM ELECTRONIC COMPONENTS

BACKGROUND OF THE INVENTION

The present invention relates to the fabrication of thin-film electronic components upon a substrate which is carried out by successive evaporation steps through metal aperture mask patterns. This system is particularly useful in fabricating large area arrays of thin film electronic components such as in a matrix display pattern.

The fabrication of thin-film integrated electronic circuits is accomplished by the vacuum deposition of appropriate materials in successive steps and in precise patterns upon a substrate. Metal aperture masks are used to define the required pattern of evaporated materials of metals, insulators, and semiconductor materials, which comprise a thin-film transistor integrated circuit. It has been the practice to utilize a separate metal aperture mask for defining a specific portion of the pattern for each deposition step, that is, for the transistor semiconductive portion, the source and drain electrodes, insulating layers, and gate means, and interconnecting bus bars. A complex mechanical jigging system is utilized to position the subsequently utilized aperture mask and position it accurately over the partially fabricated electronic component upon the substrate so that the next vacuum deposited layer patterns may be laid down. In fabricating a matrix display panel thousands of electronic thin-film components may be arrayed across a substrate area with individual portions of the circuitry such as interconnecting conductive bus bars and semiconductive channels and gates being only one or two mils in width, so that mask-to-mask alignments must be very accurate typically within 0.1 to 0.2 mils. A serious drawback to the mechanical alignment pin type of alignments is that the pins wear with use, and the mask alignment holes tend to become enlarged resulting in mask misalignment.

The need to select, handle, move and align a plurality of such aperture masks in a sequence within the vacuum chamber gives rise to numerous opportunities for positioning and alignment errors to occur during the fabrication sequence.

SUMMARY OF THE INVENTION

A system is disclosed for fabricating thin-film electronic components upon a substrate, wherein a unitary aperture mask is utilized which includes a plurality of discrete spaced apart aperture patterns formed in the single mask. The mask has alignment position indicia aligned with each of the discrete spaced apart aperture patterns and the mask is movable to an alignment position above the substrate. Position indicia sensing and indicating means are provided for determining when a desired aperture pattern is aligned between the evaporate source and the substrate. This system preferably includes a linear motion apparatus means which is coupled with a fiber optic light sensing position indicating means.

DESCRIPTION OF THE PREFERRED EMBODIMENT

Figure 1:
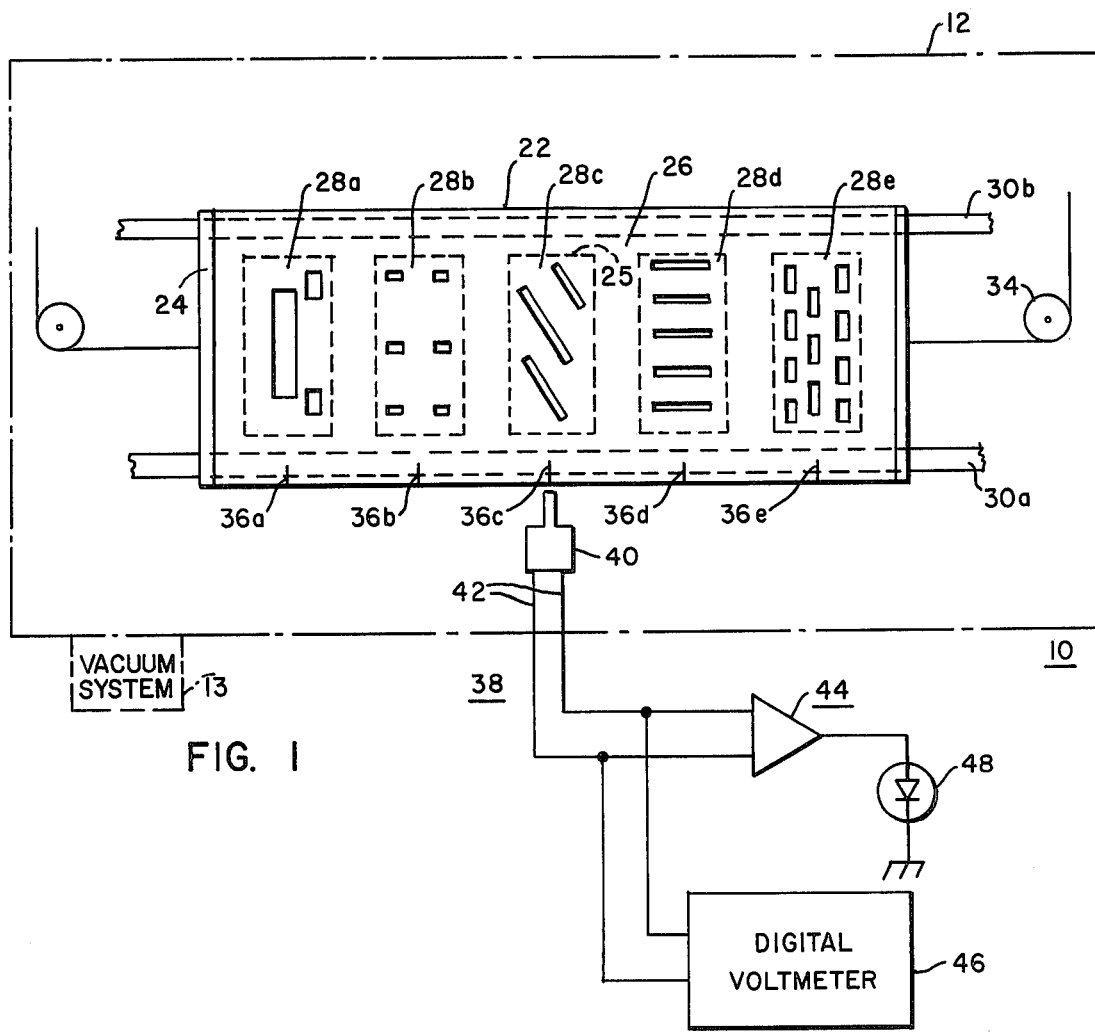
FIG. 1 is a schematic representation of the thin-film deposition system of the present invention.
Figure 2:
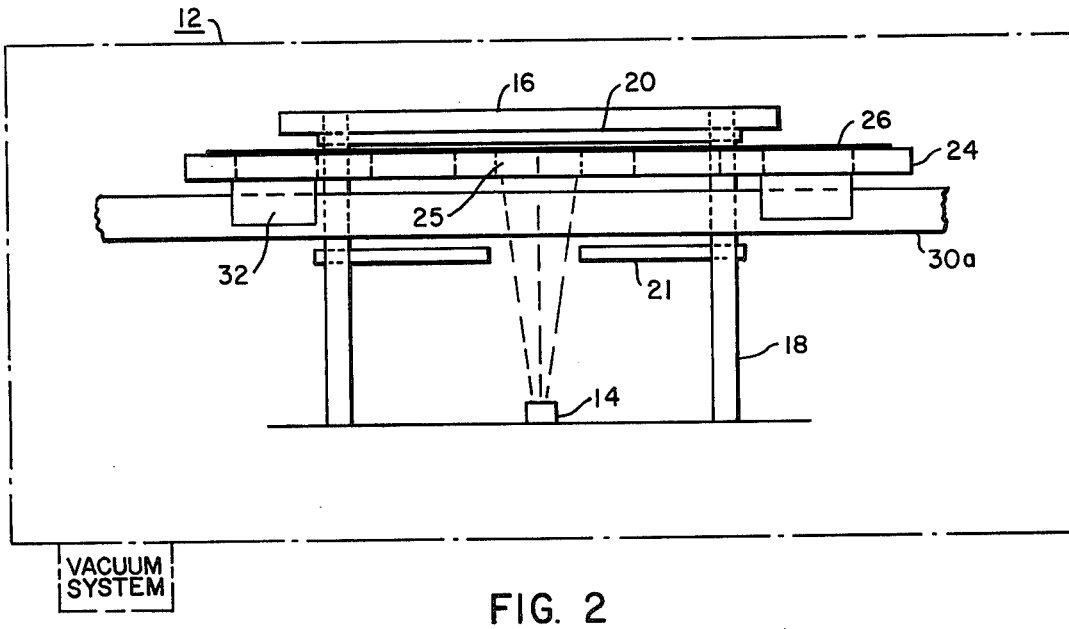
FIG. 2 is a side elevational view of the system seen in FIG. 1.

The thin-film vacuum deposition system 10 seen in FIGS. 1 and 2 comprises an evacuable chamber 12 illustrated in broken line in FIGS. 1 and 2, which chamber 12 is connected to a vacuum pump system 13 for producing a highly evacuated condition within the chamber 12. A plurality of evaporant material sources 14 are disposed within the chamber 12 and are alignable with a substrate holder 16. Such sources 14 are typically disposed on a turntable for rotation to position for evaporation. The substrate holder 16 is preferably fixed in place as by supporting legs 18. The substrate plate 20 is held in place against the underside of substrate holder 16 aligned directly over the desired evaporant source 14 for deposition of the desired material. The substrate periphery is held in place against the substrate holder by mechanical means not shown. An evaporation shield 21 may be disposed beneath the mask holder between the evaporant source 14 and the mask holder aperture 25.

A movable aperture mask means 22 comprises a mask holder 24 having the unitary composite mask 26 affixed thereon. The composite unitary mask 26 comprises a thin metal elongated sheet with a plurality of linearly aligned aperture patterns 28a, 28b, 28c, 28d, 28e formed thereon and therethrough. The mask holder 24 has a centralized open mask area aperture 25 which is approximately equal in area to an aperture pattern. The mask holder 24 is supported upon a pair of parallel linear rails 30a and 30b, for example, by split bearings 32 connected to the underside of the mask holder. The bearings 32 are fitted upon the rails 30a, 30b to permit linear movement of the entire mask holder linearly along the rails, to permit alignment of a selected aperture pattern on the mask between the substrate and the evaporant source. The mask holder 24 is attached to linear motion drive mechanism 34, which can simply comprise a chain driven by a sprocket connected to a gear driven manually or by a motor, which are only schematically illustrated in FIG. 1. The mask 26 can be mechanically mounted on the mask holder or held in place by magnetic means as is well known.

A plurality of light reflective or absorptive alignment position indicia markings 36a–36e are provided upon the mask 26, with each individual marking being very accurately aligned with a specific aperture pattern upon the mask. The markings are rulings which are lighter or darker than the mask, and are typically aligned with the midpoint of the aperture pattern. A position indicia sensing and indicating system 38 includes a combination position sensing and illuminating head 40. The head 40 includes a light emitting diode illuminator and phototransistor receptor disposed at the end of a coaxial fiber optic bundle sensor which is directed toward and aligned over the mask 26, so that the markings 36a–36e pass under the head 40. Sensor leads 42 extend from the phototransistor receptor portion of the head 40, and are connected to an electronic means 44 which permit indication of the alignment and positioning of the mask when the marking 36 is centered beneath the head 40. The electronic means 44 includes amplifier and Schmitt trigger means, the output of which is fed to a light emitting diode indicator to provide visual indication of the centering of the marking and the aperture pattern. A digital voltmeter 46 is also connected to the sensor leads to provide a meter voltage value which is a function of the reflected light amplitude resulting from reflection from the marking.

The mask and alignment system described herein avoids the use of individual masks and associated alignment pins and other mechanical alignment guides. This system utilizes an optical electronic detector system to accurately locate the mask position in an accurate and reproducible manner. Sequential selection of the desired mask pattern is accomplished by actuating the motion assembly to move the mask holder and mask in the linear direction permitted by the parallel rails upon which the mask holder is mounted. The optical position sensor consists of an infrared light emitting diode illuminator and an infrared phototransistor receptor contained in a single housing. Light from the light emitting diode is transmitted through the center of a coaxial fiber optic bundle where it strikes the alignment markings upon the mask. The light reflected from the markings upon the mask is transmitted back through the outer portion of the coaxial light pipe where it is detected by the phototransistor. The output voltage of the phototransistor appears at the output sensor leads and varies as a function of the reflected light amplitude. Individual white or black fiducial marking lines can serve as the markings or alignment positions associated with each aperture mask pattern upon the mask.

In operation, the mask and holder assembly is moved along the prescribed linear direction of the parallel rails until the appropriate alignment mark passes under the sensor head. When the mask aperture pattern desired is within approximately 1 mil of the proper position between the substrate and evaporant source, the amplifier and Schmitt trigger circuit is activated and causes the light emitting diode indicator to light as an operator signal. The system can be semi-automatic and the light emitting diode can act as an indication to the operator that alignment is being approached. The digital voltmeter connected to the sensor output leads monitors the amplitude of the reflected sensor signal. As the mask is advanced further, this voltage increases reaching a maximum value when the alignment marking is located precisely over the center axis of the sensor fiber optic bundle. At this point the mask is perfectly positioned and the deposition can then be carried out. Subsequent alignment and linear movement of the mask to position the desired aperture pattern between the substrate and the evaporant source can be carried out in the same way. The system can be fully automated so that the output voltage from the phototransistor is utilized and compared to a reference value to control the drive mechanism for actuating and control the motor drive for moving the mask holder.

The plurality of individual aperture patterns upon the unitary or composite mask which is disposed upon the mask holder are arranged sequentially. The aperture patterns are formed photographically during the generation of the master artwork followed by selective etching to produce the aperture pattern which can be positioned very precisely with respect to each other. The composite mask contains as many aperture patterns as is required for a particular circuit and will vary depending upon the complexity of the circuit, and for a relatively simple thin-film electronic circuit will comprise approximately 6 to 10 aperture patterns. There would typically be evaporant sources for the conductors, the insulators, and the semiconductive materials, which would be moved into position as desired and aligned with the substrate.

We claim:

1. A system for fabricating thin-film electronic components upon a substrate comprising:
   (a) an evacuable chamber connectable to a vacuum system; and within the chamber are disposed,
   (b) at least one evaporant material source;
   (c) a substrate holder alignable with the evaporant source;
   (d) movable aperture mask means comprising guide means on which is movably mounted a mask holder, a unitary elongated aperture mask supported by the mask holder between the substrate holder and the aligned evaporant source, which aperture mask has discrete spaced apart aperture patterns in a linear array, which guide means are linear parallel rails extending in the direction of the linear array of aperture patterns, with the mask holder slidably mounted on said rails so that the aperture mask is constrained to movement in the direction of the linear array, and wherein the aperture mask has light reflective or absorptive alignment position indicia disposed thereon aligned with each of the discrete spaced apart aperture patterns; and
   (e) position indicia sensing and indicating means including fiber optic means, aligned with the substrate holder and the evaporant source, for directing light onto the aperture mask position indicia and for collecting light from the position indicia to permit determining when a desired aperture pattern is aligned between the evaporant source and the substrate.

* * * * *